United States Patent [19]
Sato et al.

[11] Patent Number: 5,884,831
[45] Date of Patent: Mar. 23, 1999

[54] ULTRASONIC VIBRATION BONDING CHIP MOUNTER

[75] Inventors: Shigeru Sato; Mitsugu Katsumi; Seiya Nakai, all of Fukuoka-ken, Japan

[73] Assignee: Ultex Corporation, Fukuoka, Japan

[21] Appl. No.: 845,372

[22] Filed: Apr. 24, 1997

[30] Foreign Application Priority Data

Jul. 5, 1996 [JP] Japan .................................. 8-176676

[51] Int. Cl.$^6$ ............................. B23K 31/02; B23K 37/04
[52] U.S. Cl. ................................ 228/6.2; 228/9; 228/49.5
[58] Field of Search ................................ 228/1.1, 6.2, 9, 228/49.5

[56] References Cited

U.S. PATENT DOCUMENTS 3,790,738  2/1974  Laub et al. ............................... 228/1.1
5,437,301  7/1995  Pham et al. .

FOREIGN PATENT DOCUMENTS 57-63835  4/1982  Japan ...................................... 228/6.2
61-263231  11/1986  Japan ...................................... 228/6.2
3-129844  6/1991  Japan ...................................... 228/6.2

*Primary Examiner*—Patrick Ryan
*Assistant Examiner*—Jeffrey T. Knapp
*Attorney, Agent, or Firm*—Kanesaka & Takeuchi

[57] ABSTRACT

An ultrasonic vibration bonding chip mounter includes a chip carrying unit arranged above a chip supply unit, a prealignment unit and a mounting unit which are arranged in a row and having a movable table which can move back and forth in a direction parallel to a direction where these units are arranged, a pick-up unit, attached to the movable table, for transferring a chip from the chip supply unit to the prealignment unit, and an ultrasonic vibration bonding unit, attached to the movable table, for transferring the chip from the prealignment unit to a mounting unit so that the chips are transferred from the chip supply unit to the prealignment unit and further to the mounting unit by the reciprocation of the movable table one by one.

4 Claims, 3 Drawing Sheets and placing the chip on the mount table by means of a bonding working portion of a resonator connected to a transducer for generating ultrasonic vibration, the structure of a pick-up unit and the ultrasonic vibration bonding unit being simplified.

ULTRASONIC VIBRATION BONDING CHIP MOUNTER

BACKGROUND OF THE INVENTION

1. Field of the Invention

This invention relates to a chip mounter for positioning a chip of a semiconductor element or the like (lightweight and compact product) such as a bare chip on a substrate such as a wiring board and bonding the chip to the substrate with ultrasonic vibration.

2. Description of the Prior Art

As disclosed in U.S. Pat. No. 5,427,301, it has been known that when an unpackaged bare chip type semiconductor element is to be mounted on a wiring board for testing such as a burn-in test or a bare chip type semiconductor element which is verified as satisfactory in a burn-in test is to be mounted on a wiring board for packaging in place of a lead frame, it is mounted on a wiring board making use of ultrasonic vibration.

The above ultrasonic vibration bonding chip mounter has such a problem that the movements and position controls of a pick-up unit and an ultrasonic vibration bonding unit become complicated inevitably when a chip is to be mounted on a chip mounting position of a substrate for mounting the chip on a mount table through a prealignment table from a pallet table because the pick-up unit and the ultrasonic vibration bonding unit are not arranged apart from each other with reference to the installation position relationship among the pallet table of a chip supply unit, the prealignment table of a prealignment unit and the mount table of a mounting unit.

SUMMARY OF THE INVENTION

It is therefore an object of the present invention to provide an ultrasonic vibration bonding chip mounter which is capable of mounting a chip on a chip mounting position of a substrate on a mount table from a pallet table through a prealignment table by controlling the positions of a pick-up unit and an ultrasonic vibration bonding unit to a forward movement limit position and a backward movement limit position and of bonding the chip to the substrate with ultrasonic vibration for packaging.

According to a first aspect of the present invention, there is provided an ultrasonic vibration bonding chip mounter comprising:

a chip supply unit having a pallet table on which a chip to be mounted is set at a specified position;

a prealignment unit having a prealignment table for roughly positioning the chip;

a mounting unit for controlling the position of a mount table so that the chip mounting position of a substrate on the mount table is aligned with a predetermined mounting position, the chip supply unit, the prealignment unit and the mounting unit being arranged in a row at equal intervals;

a chip carrying unit arranged above the chip supply unit, the prealignment unit and the mounting unit and having a movable table whose position is controlled such that it moves back and forth between two positions in a direction where the chip supply unit, the prealignment unit and the mounting unit are arranged;

a pick-up unit having a vertically movable pick-up arm for picking up the chip from the pallet table and placing the chip on the prealignment table;

an ultrasonic vibration bonding unit, having a pick-up function and movable vertically, for picking up the chip and placing the chip on the mount table by means of a bonding working portion of a resonator connected to a transducer for generating ultrasonic vibration, the pick-up unit and the ultrasonic vibration bonding unit being attached to the movable table of the chip carrying unit with the same space therebetween as the space between the prealignment unit and the chip supply unit and the space between the prealignment unit and the mounting unit; and a measuring unit for detecting the chip to be mounted and picked up by the bonding working portion of the resonator and the substrate on the mount table and outputting an output for aligning the chip with the chip mounting position of the substrate to the mounting unit.

Since the chip can be transferred from the chip supply unit to the prealignment unit and further to the mounting unit by the reciprocation of the movable table between two positions, accurately located at a predetermined position of the substrate in the end and bonded with ultrasonic vibration, a highly reliable product can be obtained.

According to a second aspect of the present invention, there is provided an ultrasonic vibration bonding chip mounter in which the chip supply unit has a means for controlling the position of the pallet table so that one of a plurality of chips on the pallet table can be set at a predetermined pick-up position. Since a large number of chips can be installed on the pallet table, working efficiency can be improved.

According to a third aspect of the invention, there is provided an ultrasonic vibration bonding chip mounter in which the measuring unit comprises a camera which enters the space between the ultrasonic vibration bonding unit and the mounting unit which face each other in a vertical direction from sideways and picks up images of both the chip and the substrate to obtain the positional relationship between the chip and the chip mounting position of the substrate. Since the positional relationship between the chip and the substrate can be measured accurately with a simple structure, the accurate positioning of the chip is possible.

According to a fourth aspect of the present invention, there is provided an ultrasonic vibration bonding chip mounter comprising:

a chip supply unit for controlling the position of a pallet table so that one to be mounted out of a large number of chips on the pallet table is located at a predetermined pick-up position;

a prealignment unit having a prealignment table for roughly positioning the chip;

a mounting unit for controlling the position of a mount table so that the chip mounting position of a substrate on the mount table is aligned with a predetermined mounting position, the chip supply unit, the prealignment unit and the mounting unit being arranged in a row at equal intervals;

a chip carrying unit arranged above the chip supply unit, the prealignment unit and the mounting unit and having a movable table whose position is controlled such that it moves back and forth between two positions in a direction where the chip supply unit, the prealignment unit and the mounting unit are arranged;

a pick-up unit having a vertically movable pick-up arm for picking up the chip from the pallet table and placing the chip on the prealignment table;

an ultrasonic vibration bonding unit, movable vertically and having a pick-up function, for picking up the chip from the prealignment table and placing the chip on the mount table by means of a bonding working portion of a resonator connected to a transducer for generating ultrasonic vibration, the pick-up unit and the ultrasonic vibration bonding unit being attached to the movable table of the chip carrying unit with the same space therebetween as the space between the prealignment unit and the chip supply unit and the the space between the prealignment unit and the mounting unit; and a measuring unit for picking up images of the chip to be mounted and picked up by the bonding working portion of the resonator and the substrate on the mount table when it enters the space between the ultrasonic vibration bonding unit and the mounting unit which face each other in a vertical direction from sideways and outputting an output for aligning the chip and the chip mounting position of the substrate to the mounting unit.

Since the pick-up unit and the ultrasonic vibration bonding unit are attached to the movable table of the chip carrying unit with a predetermined space therebetween, the pick-up arm of the pick-up unit and the bonding working portion having a nozzle function of the ultrasonic vibration bonding unit move to and stop at the forward movement limit position and the backward movement limit position repeatedly with a predetermined space therebetween, the pick-up arm transfers the chip from the pallet table to the prealignment table, and the bonding working portion transfers the chip from the prealignment table to the mounting position of the substrate on the mount table and bonds it with ultrasonic vibration to package it on the substrate.

The above and other objectives, features and advantages of the invention will become more apparent from the following description when taken in conjunction with the accompanying drawings.

DETAILED DESCRIPTION OF THE PREFERRED EMBODIMENT

Figure 1:
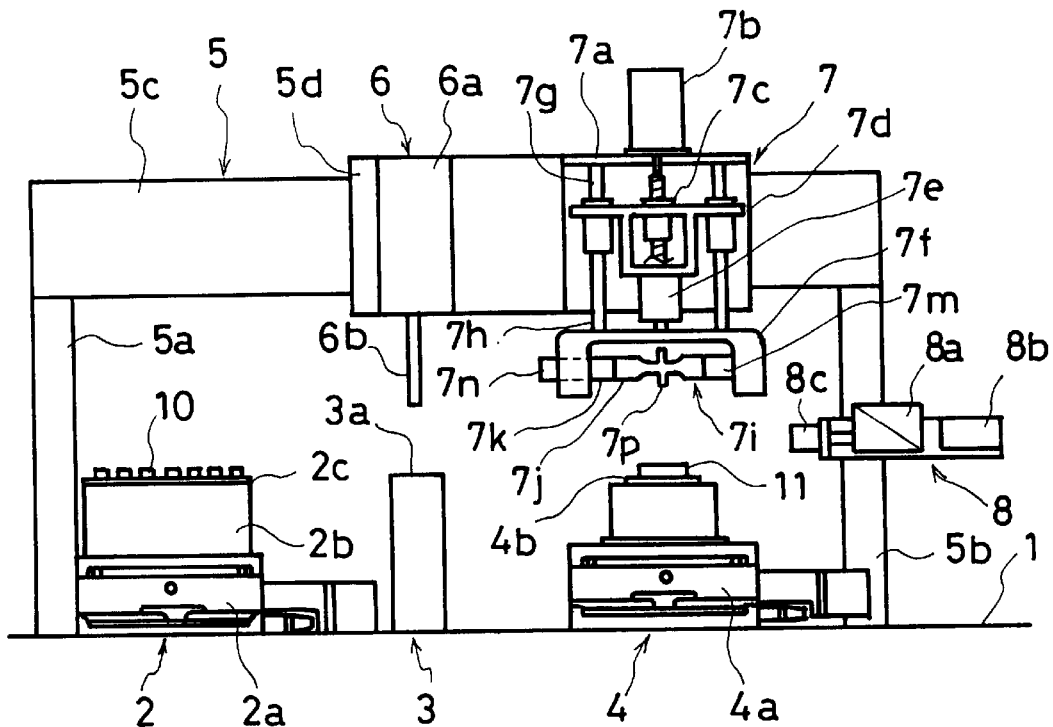
FIG. 1 is a side view of an embodiment of the present invention.

FIGS. 1 to 7 show a preferred embodiment of the present invention. In FIG. 1, a chip supply unit 2, a prealignment unit 3 and a mounting unit 4 are arranged in a row on an installation base 1 of an ultrasonic vibration bonding chip mounter.

The chip supply unit 2 comprises an X-Y drive unit 2a installed on the installation base 1 and a pallet table 2b connected to the X-Y drive unit 2a. The X-Y drive unit 2a moves the pallet table 2b in X and Y directions which are lengthwise and crosswise directions of a plane parallel to the installation base 1 to control the position of the pallet table 2b so that one chip 10 out of a large number of chips 10 stored in a pallet 2c installed on the pallet table 2b is located at a predetermined pick-up position.

The prealignment unit 3 comprises a prealignment table 3a having an unshown uneven surface for roughly positioning the chip 10 to be mounted on the surface thereof.

The mounting unit 4 comprises an X-Y-θ drive unit 4a installed on the installation base 1 and a mount table 4b connected to the X-Y-θ drive unit 4a. The X-Y-θ drive unit 4a moves the mount table 4b in X and Y directions which are lengthwise and crosswise directions of a plane parallel to the installation base 1 and a θ direction which is an elevation angle with respect to the installation base 1 according to an output from a measuring unit 8 to be described later to control the position of the mount table 4b so that the chip mounting position of a substrate 11 for mounting the chip installed on the mount table 4b is aligned with a predetermined mounting position.

A chip carrying unit 5 is installed on the installation base 1. The chip carrying unit 5 comprises a horizontal rail 5c which is laid above the chip supply unit 2, the prealignment unit 3 and the mounting unit 4 and supported by a plurality of columns 5a and 5b installed upright on the installation base 1 and a movable table 5d, attached to the horizontal rail 5c, which can move back and forth. An unshown actuator such as a motor controls the position of the movable table 5d so that it can move back and forth between its forward movement limit position and backward movement limit position. A pick-up unit 6 and an ultrasonic vibration bonding unit 7 are installed on the movable table 5d with a predetermined space therebetween in such a manner that they are arranged in a row.

Figure 3:
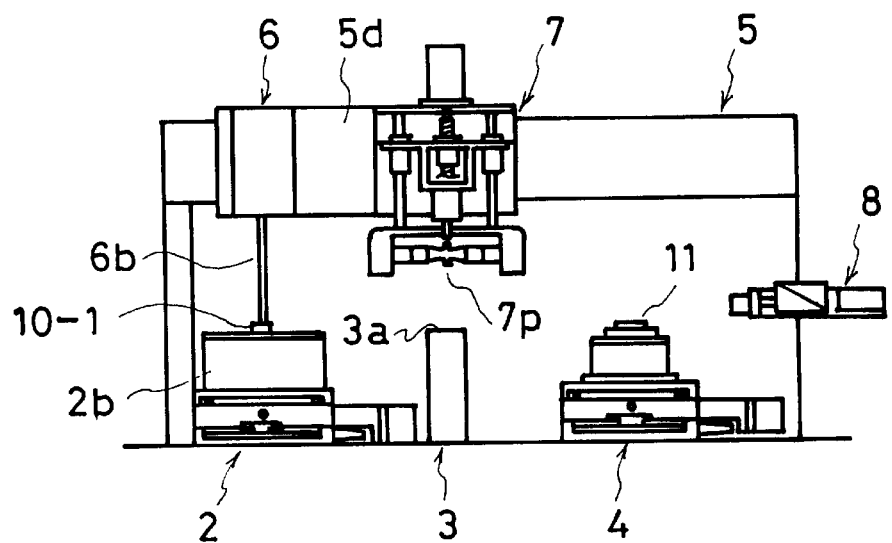
FIG. 3 is a side view showing the first step of the embodiment of the present intention.
Figure 4:
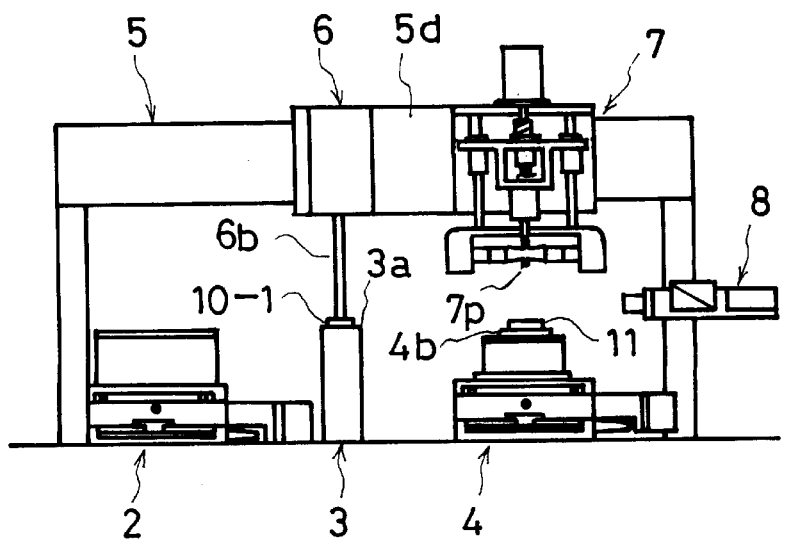
FIG. 4 is a side view showing the second step of the embodiment of the present invention.
Figure 5:
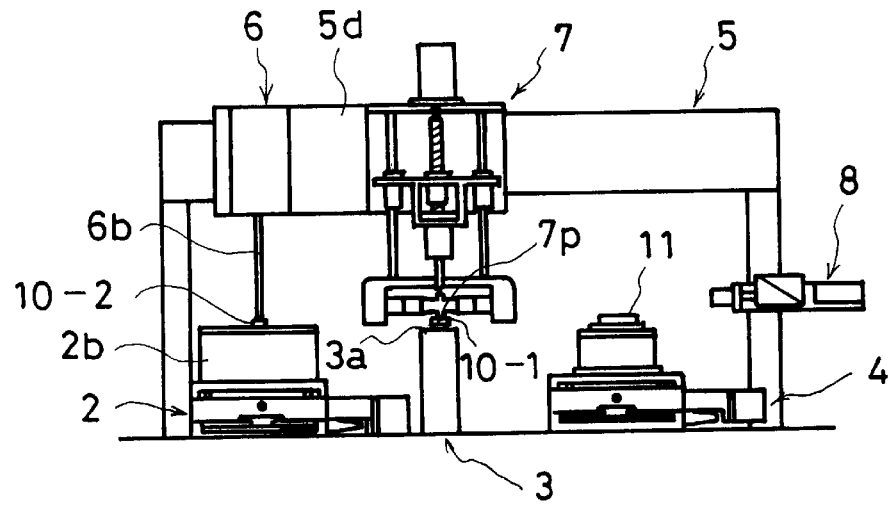
FIG. 5 is a side view showing the third step of the embodiment of the present invention.

This predetermined space is sized such that, when the movable table 5d stops at its right backward movement limit position as shown in FIGS. 1, 4, 6 and 7, a top end of a pick-up arm 6b of the pick-up unit 6 faces a prealignment position on the prealignment table 4a and a bonding working portion 7p of a resonator 7i of the ultrasonic vibration bonding unit 7 faces a mounting position on the mount table 4b in a vertical direction whereas when the movable table 5d stops at its left forward movement limit position as shown in FIGS. 3 and 5, the top end of the pick-up arm 6b of the pick-up unit 6 faces a pick-up position on the pallet table 2b and the bonding working portion 7b of the ultrasonic vibration bonding unit 7 faces a prealignment position on the prealignment table 3a in a vertical direction.

The pick-up unit 6 comprises a unit base portion 6a installed on the movable table 5b and a pick-up arm 6b extending downward from the unit base portion 6a. The unshown actuator incorporated in the unit base portion 6a moves vertically the pick-up arm 6b between its upward movement limit position shown in FIG. 1 and its downward movement limit position shown in FIGS. 3 and 4. The downward movement limit position of this pick-up arm 6b is a controlled position where the top end of the pick-up arm 6b can suck and adsorb the chip 10 on the pallet table 2b and the chip sucked by and adsorbed to the pick-up arm 6b can be mounted on the prealignment table 3a. Although a motor or an air cylinder can be used practically as the actuator, it is desirable that the pick-up arm 6b should be moved vertically in such a manner that its rotation is prevented by a bolt-nut unit and a guide unit when the motor is used and a buffer unit should be provided to prevent an impact on the chip 10 when the air cylinder is used.

The pick-up arm 6b of this embodiment has a nozzle function. In other words, the pick-up arm 6b is formed like a pipe and a rear end thereof is connected to an unshown suction generation source such as a vacuum pump through an unshown valve. When this unshown valve is switched from an air open side to a suction side, the pick-up arm 6*b* sucks the open air from an opening in the end thereof by the suction operation of the suction generation source, whereby the chip 10 is sucked and adsorbed. Conversely, when the valve is switched from the suction side to the air open side, the inside of the pick-up arm 6*b* is filled with air, whereby the sucked and adsorbed chip 10 is released.

The ultrasonic vibration bonding unit 7 comprises a fixing base 7*a* installed on the movable table 5*d*, a motor 7*b* such as a servo motor installed on the fixing base 7*a*, a bolt-nut unit 7*c* connected to the output shaft of the motor 7*b*, a lift base 7*d* in which a nut of the bolt-nut unit 7*c* is formed, an air cylinder 7*e* attached to the lift base 7*d*, a holder 7*f* connected to a piston rod of the air cylinder 7*e*, and a resonator 7*e* attached to the holder 7*f*. When the motor 7*b* rotates normally, the screw of the bolt-nut unit 7*c* rotates normally and the lift base 7*d* is moved down by the nut screwed onto the screw. When the motor 7*b* rotates reversely, the screw of the bolt-nut unit 7*c* rotates reversely and the lift base 7*d* is moved up by the nut. The lift base 7*d* is slidably fitted onto the right and left guide poles 7*g* installed upright on the under surface of the fixing base 7*a* so that it does not rotate but move vertically. A lower end of a guide shaft 7*h* stored in each of the right and left guide poles 7*g* in such a manner that it can move vertically is connected to the holder 7*f* and is moved vertically by the expansion and contraction of the air cylinder 7*e* and the vertical movement of the lift base 7*d* so that the holder 7*f* is held in parallel to the installation base 1.

The resonator 7*i* comprises a horn 7*j* and two boosters 7*k* and 7*m* coaxially connected to the both ends of the horn 7*j*. The boosters 7*k* and 7*m* are attached to the holder 7*f* in such a manner that they are both supported by arm portions extending downward from right and left sides of the holder 7*f*. To the booster 7*k* is coaxially connected a transducer 7*n* which is an energy converter such as a piezoelectric or magnetorestrictive element for converting into mechanical energy electric energy for outputting and generating vertical ultrasonic vibration having a predetermined frequency with power supplied from an unshown ultrasonic generator by an unshown headless screw and threaded hole.

Figure 2:
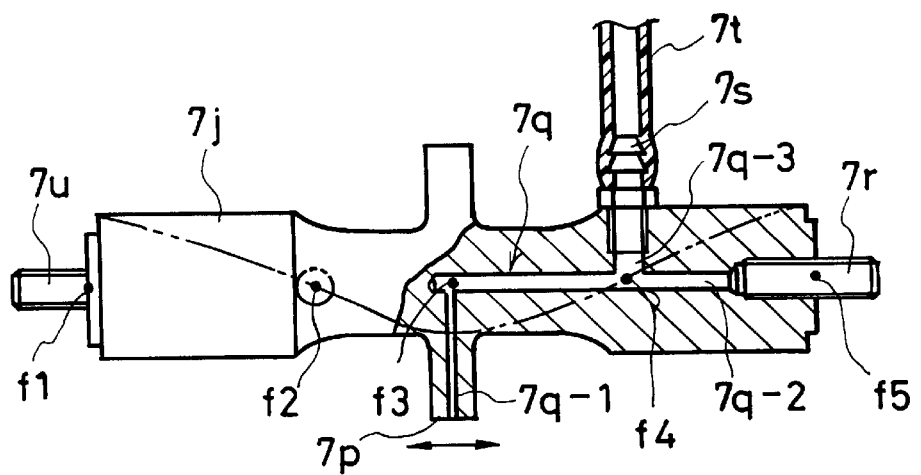
FIG. 2 is a partially broken side view of a horn according to the embodiment of the present invention.

The horn 7*j* of this embodiment, as shown in FIG. 2, has a length equal to the wavelength of the resonance frequency which resonates with ultrasonic vibration from the transducer 7*n* and has a bonding working portion 7*p* projecting outward at the central maximum vibration amplitude point f3. The bonding working portion 7*p* has an end surface formed to have a plane area larger than the chip 10 and a nozzle function.

In other words, the horn 7*j* has a passage 7*q* connected to a hose. The passage 7*q* is formed by a vertical hole 7*q*-1 extending from the center of the end surface of the bonding working portion 7*p* to the center of the horn 7*j* through the inside of the bonding working portion 7*p*, a horizontal hole 7*q*-2 extending from the center of the other end surface of the horn 7*j* at the maximum vibration amplitude point f5 to the vertical hole 7*q*-1, and a vertical hole 7*q*-3 extending from the outer peripheral surface of the horn 7*j* at the minimum vibration amplitude point f4 to the horizontal hole 7*q*-2. An headless screw 7*r* is fitted in the end surface of the horn 7*j* to which the horizontal hole 7*q*-2 is open. The headless screw 7*r* covers up the opening of the horizontal hole 7*q*-2 and connects the booster 7*m* coaxially to the horn 7*j*. A hose mouth 7*s* is fitted into the opening of the vertical hole 7*q*-3 and one end of the hose 7*t* is fitted onto the hose mouth 7*s* projecting from the horn 7*j* so that the inside cavity of the hose 7*t* is connected to the passage 7*q* through the inside through hole of the hose mouth 7*s*. The other end of the hose 7*t* is connected to the unshown suction generation source such as a vacuum pump with an unshown valve.

When this unshown valve is switched from an air open side to a suction side, the bonding working portion 7*p* sucks the open air from an opening in the end thereof by the suction operation of the suction generation source, whereby the chip 10 is sucked and adsorbed. Conversely, when the valve is switched from the suction side to the air open side, the passage 7*q* is filled with air, whereby the sucked and adsorbed chip 10 is released. A headless screw 7*u* for connecting the booster 7*k* coaxially to the horn 7*j* is fitted in the other end surface of the horn 7*j* at the maximum vibration amplitude point f1. These headless screws 7*r* and 7*u* are screwed in threaded holes formed in the horn 7*j*.

Back to FIG. 1, a measuring unit 8 for aligning the chip 10 and the substrate 11 is provided above the mount table 4*b* off to the right on the side opposite to the prealignment table 3*a* of the mount table 4*b*. The measuring unit 8 comprises a bi-field optical lens 8*a*, a CCD camera 8*b* for picking up images of the chip 8 adsorbed to the horn 7*j* to be measured and the substrate 11 on the mount table 4*b* both of which are arranged spaced apart from each other in a vertical direction through the bi-field optical lens 8*a* and converting the images into electric signals, and an actuator 8*c* for moving the bi-field optical lens 8*a* to a measuring position.

Describing the operation of this embodiment with reference to FIGS. 3 to 7, in the first step, when the movable table 5*d* of the chip carrying unit 5 moves to the left from the backward movement limit position shown in FIG. 1 and stops at the forward movement limit position shown in FIG. 3, the pick-up arm 6*b* falls down, picks up the chip 10-1 to be mounted from the pallet table 2*b* by suction and rises.

In the second step, when the movable table 5*d* moves to the right from the forward movement limit position shown in FIG. 3 and stops at the backward movement limit position shown in FIG. 4, the pick-up arm 6*b* falls, places the chip 10-1 on the prealignment table 3*a* by filling air and rises. When the chip 10-1 is placed on the prealignment table 3*a*, it is roughly positioned by the uneven surface of the prealignment table 3*a*.

In the third step, when the movable table 5*d* moves to the left again and stops at the forward movement limit position shown in FIG. 5, the horn 7*j* of the ultrasonic vibration bonding unit 7 falls, picks up the chip 10-1 from the prealignment table 3*a* by suction and rises. Simultaneously with the pick-up of the chip 10-1, the pick-up arm 6*b* falls, picks up the chip 10-2 to be mounted next from the pallet table 2*b* by suction and rises (the same movement as in the step 1).

Figure 6:
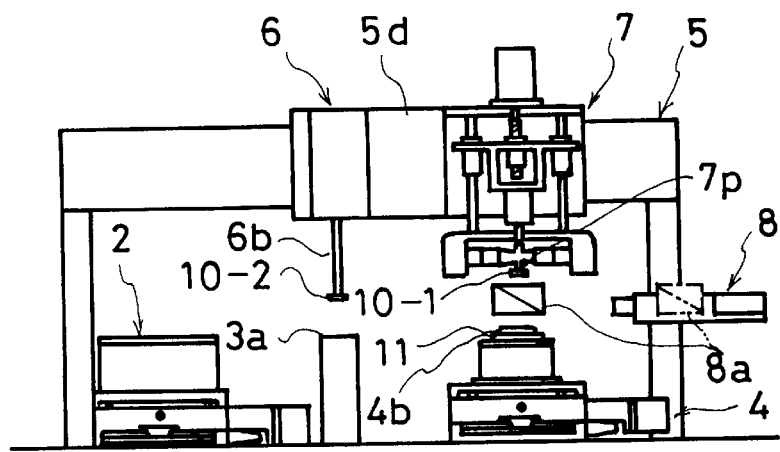
FIG. 6 is a side view showing the fourth step of the embodiment of the present invention.

In the fourth step, when the movable table 5*d* moves to the right again and stops at the backward movement limit position shown in FIG. 6, the bi-field optical camera 8*a* enters the space between the chip 10-1 adsorbed to the bonding working portion 7*p* of the ultrasonic vibration bonding unit 7 and the substrate 11 on the mount table 4*b* as shown by a solid line from a position shown by a virtual line and measures the displacement between the chip 10-1 and the substrate 11. Based on the result of this measurement, the mount table 4*b* is driven to X, Y and θ directions to correct the position of the substrate 11 based on the chip 10-1 so that the chip mounting position of the substrate 11 is accurately aligned with the chip 10-1. When alignment between the chip mounting position of the substrate 11 and the chip 10-1 in a vertical direction by the above correction is completed, the bi-field optical camera 8a returns to the original position shown by the virtual line from the position shown by the solid line.

Figure 7:
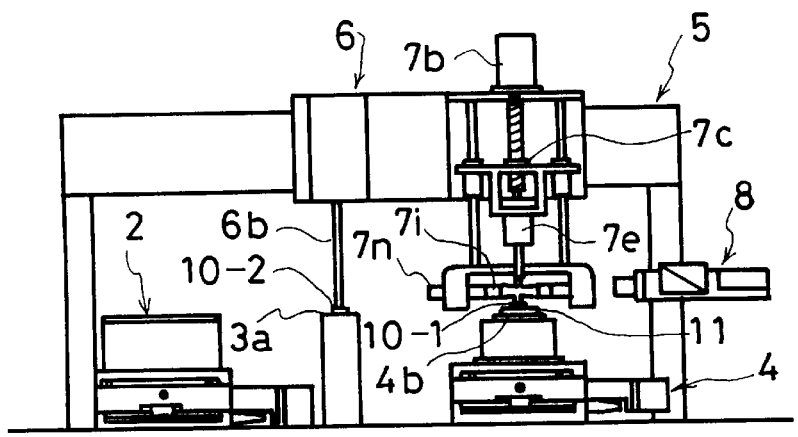
FIG. 7 is a side view showing the fifth step of the present invention.

In the fifth step, as shown in FIG. 7, the resonator 7i of the ultrasonic vibration bonding unit 7 falls and the transducer 7n oscillates ultrasonic vibration while the resonator 7i presses the chip 10-1 against the substrate 11. The resonator 7i resonates with this ultrasonic vibration, ultrasonic vibration produced by the resonance is applied to the interface between the substrate 11 and the chip 10-1, and the chip 10-1 is bonded to the substrate 11 at the mounting position. Pressurization for pressing the chip 10-1 against the substrate 11 is carried out by the descent of the air cylinder 7e of the ultrasonic vibration bonding unit 7 and the descent of the bolt-nut unit 7c by the motor 7b. The control of the pressurizing force is carried out by the output of the air cylinder 7e. Simultaneously with the mounting and bonding of the chip 10-1, the pick-up arm 6b falls, positions and places the chip 10-2 to be mounted next on the prealignment table 3a and rises (the same movement as in the step 2).

Thereafter, one cycle from the third step shown in FIG. 5 to the fifth step shown in FIG. 7 is repeated to accurately locate the chips at the mounting positions, which change for each of the chips 10, of the substrate on the mount table 4b, mount and bond them through the prealignment of the chips 10 to be mounted from the pallet table 2b on the prealignment table 3a one by one.

According to the constitution of this embodiment, since the pick-up unit 6 and the ultrasonic vibration bonding unit 7 are attached to the movable table 5d of the chip carrying unit 5 with a predetermined space therebetween, when the movable table 5d stops at the backward movement limit position, the pick-up arm 6b faces the prealignment position on the prealignment table 3a and the bonding working portion 7p faces the mounting position on the mount table 4b in a vertical direction, and when the movable table 5d stops at the forward movement limit position, the pick-up arm 6b faces the pick-up position on the pallet table 2b and the bonding working portion 7p faces the prealignment position on the prealignment table 3a in a vertical direction.

In short, the pick-up arm 6b of the pick-up unit 6 and the bonding working portion 7p having a nozzle function of the ultrasonic vibration bonding unit 7 move to and stop at the forward movement limit position and the backward movement limit position repeatedly with a predetermined space therebetween, the pick-up arm 6b places the chip 10 on the prealignment table 3a from the pallet table 2b, and the bonding working portion 7p mounts the chip 10 on the substrate 11 on the mount table 4b at a predetermined mounting position for the chip 10 from the prealignment table 3a and bonds it to the substrate 11 with ultrasonic vibration.

What is claimed is:

1. An ultrasonic vibration bonding chip mounter comprising:
    a chip supply unit for controlling the position of a pallet table so that one to be mounted out of a large number of chips on the pallet table is located at a predetermined pick-up position;
    a prealignment unit having a prealignment table for roughly positioning the chip;
    a mounting unit for controlling the position of a mount table so that the chip mounting position of a substrate on the mount table is aligned with a predetermined mounting position, the chip supply. unit, the prealignment unit and the mounting unit being arranged in a row at equal intervals;
    a chip carrying unit arranged above the chip supply unit, the prealignment unit and the mounting unit and having a movable table whose position is controlled such that it moves back and forth between two positions in a direction where the chip supply unit, the prealignment unit and the mounting unit are arranged;
    a pick-up unit having a vertically movable pick-up arm for picking up the chip from the pallet table and placing the chip on the prealignment table;
    an ultrasonic vibration bonding unit, movable vertically and having a pick-up function, for picking up the chip from the prealignment table and placing the chip on the mount table by means of a bonding working portion of a resonator connected to a transducer for generating ultrasonic vibration, the pick-up unit and the ultrasonic vibration bonding unit being attached to the movable table of the chip carrying unit with the same space therebetween as the space between the prealignment unit and the chip supply unit and the the space between the prealignment unit and the mounting unit; and
    a measuring unit for picking up images of the chip to be mounted and picked up by the bonding working portion of the resonator and the substrate on the mount table when it enters the space between the ultrasonic vibration bonding unit and the mounting unit which face each other in a vertical direction from sideways and outputting an output for aligning the chip and the chip mounting position of the substrate to the mounting unit.

2. An ultrasonic vibration bonding chip mounter comprising:
    a chip supply unit having a pallet table on which a chip to be mounted is set at a specified position;
    a prealignment unit having a prealignment table for roughly positioning the chip;
    a mounting unit for controlling the position of a mount table so that the chip mounting position of a substrate on the mount table is aligned with a predetermined mounting position, the chip supply unit, the prealignment unit and the mounting unit being arranged in a row at equal intervals;
    a chip carrying unit arranged above the chip supply unit, the prealignment unit and the mounting unit and having a movable table whose position is controlled such that it moves back and forth between two positions in a direction where the chip supply unit, the prealignment unit and the mounting unit are arranged;
    a pick-up unit having a vertically movable pick-up arm for picking up the chip from the pallet table and placing the chip on the prealignment table;
    an ultrasonic vibration bonding unit, having a pick-up function and movable vertically, for picking up the chip and placing the chip on the mount table by means of a bonding working portion of a resonator connected to a transducer for generating ultrasonic vibration, the pick-up unit and the ultrasonic vibration bonding unit being attached to the movable table of the chip carrying unit with the same space therebetween as the space between the prealignment unit and the chip supply unit and the space between the prealignment unit and the mounting unit; and
    a measuring unit for detecting the chip to be mounted and picked up by the bonding working portion of the resonator and the substrate on the mount table and outputting an output for aligning the chip with the chip mounting position of the substrate to the mounting unit.

3. The ultrasonic vibration bonding chip mounter of claim 2, wherein the chip supply unit has a means for controlling the position of the pallet table so that one of a plurality of chips on the pallet table is set at a predetermined pick-up position.

4. The ultrasonic vibration bonding chip mounter of claim 2, wherein the measuring unit comprises a camera, which enters the space between the ultrasonic vibration bonding unit and the mounting unit which face each other in a vertical direction from sideways, for picking up images of both the chip and the substrate for mounting the chip to obtain the positional relationship between the chip and the chip mounting position of the substrate.

* * * * *